United States Patent
Lee et al.

(10) Patent No.: US 8,573,264 B2
(45) Date of Patent: Nov. 5, 2013

(54) RETICLE POD HAVING FUNCTION OF GAS EXCHANGE

(75) Inventors: Ni-Shin Lee, Tucheng (TW); Shao-Wei Lu, Tucheng (TW)

(73) Assignee: Gudeng Precision Industrial Co, Ltd, Taipei County (TW)

( * ) Notice: Subject to any disclaimer, the term of this patent is extended or adjusted under 35 U.S.C. 154(b) by 208 days.

(21) Appl. No.: 12/983,355

(22) Filed: Jan. 3, 2011

(65) Prior Publication Data

US 2011/0253591 A1 Oct. 20, 2011

(30) Foreign Application Priority Data

Apr. 19, 2010 (TW) .............................. 99112117 A (51) Int. Cl.
*B65D 85/48* (2006.01)

(52) U.S. Cl.
USPC ............. 141/63; 141/98; 206/213.1; 414/939

(58) Field of Classification Search
USPC .............. 206/710, 714, 722, 723, 724, 213.1; 355/72, 75; 141/64; 414/939, 63, 98
See application file for complete search history.

(56) References Cited

U.S. PATENT DOCUMENTS

| | | | | |
|---|---|---|---|---|
| 5,590,787 A | * | 1/1997 | Hodges | 206/724 |
| 5,673,795 A | * | 10/1997 | Clatanoff et al. | 206/719 |
| 6,269,945 B1 | * | 8/2001 | Colombo | 206/213.1 |
| 7,607,543 B2 | * | 10/2009 | Gregerson et al. | 206/710 |
| 7,775,363 B2 | * | 8/2010 | Durben et al. | 206/454 |
| 7,841,820 B2 | * | 11/2010 | Bonora et al. | 414/217.1 |
| 8,235,212 B2 | * | 8/2012 | Heerens | 206/454 |
| 2009/0038976 A1 | * | 2/2009 | Lin et al. | 206/454 |
| 2011/0253591 A1 | * | 10/2011 | Lee et al. | 206/710 |

* cited by examiner

*Primary Examiner* — David Fidei
(74) *Attorney, Agent, or Firm* — Ming Chow; Sinorica, LLC (57) ABSTRACT

A reticle pod for storing reticles, into the gas channel of partition of which gas is filled through a gas inlet, wherein strong gas flow is formed around the pellicle film and the pellicle film expands outward in accordance with the Bernoulli's principle; when no gas is filled in through the gas inlet, the pellicle film contracts inward. Therefore, by turning on and shutting off the gas inlet valve, the pellicle film will be set in a breathing motion for the gas inside the pellicle film to be exchanged.

16 Claims, 5 Drawing Sheets

RETICLE POD HAVING FUNCTION OF GAS EXCHANGE

BACKGROUND OF THE INVENTION

1. Field of the Invention

The present invention is related to a storage device for storing semiconductor components or reticles, and more particularly, to a reticle pod having the function of gas exchange in the pellicle film.

2. Description of the Prior Art

In the rapidly developing modern semiconductor technology, optical lithography tool plays an important role. The pattern definition relies fully on optical lithography technology. In the application of optical lithography tool related to semiconductors, pre-designed circuit paths are fabricated as light-transparent reticle in specific form. Basing on the principle of exposure, after light from the light source passes through the reticle and is projected on a silicon wafer, specific circuit pattern can be exposed on the silicon wafer. However, since any kind of dust (such as particles, powders, and organic matters) adhering to the reticle can cause degradation of the quality of the projected pattern, the reticle used to produce pattern on silicon wafers is required to be kept absolutely clean, and the silicon wafers or other semiconductor components on which pattern is to be produced also have to be kept absolutely clean. Therefore in ordinary wafer processes, clean rooms are provided for preventing from contamination caused by particles in the air. However, the status of absolute dustless is still inaccessible in clean rooms at present.

Thus, in modern semiconductor processes, contamination-resistant reticle pods are employed for storing and transporting reticles to maintain the cleanliness of reticles; and contamination-resistant semiconductor storage device are also employed for storing and transporting semiconductor components to maintain the cleanliness of semiconductor components. The reticle pods are used to store reticles in semiconductor process to facilitate carrying and transporting of reticles between platforms and to isolate the reticles from air for preventing from contamination of reticles caused by impurities and thus leading to changes; the semiconductor storage devices are used to store semiconductor components in semiconductor process to facilitate carrying and transporting of semiconductor components between platforms and to isolate the semiconductor components from air for preventing from contamination of semiconductor components caused by impurities and thus leading to changes. Therefore, in advanced semiconductor Fabs, the cleanliness of reticle pods and semiconductor storage devices is required to comply with SMIF, i.e. the cleanliness is maintained below Class 1.

Figure 7:
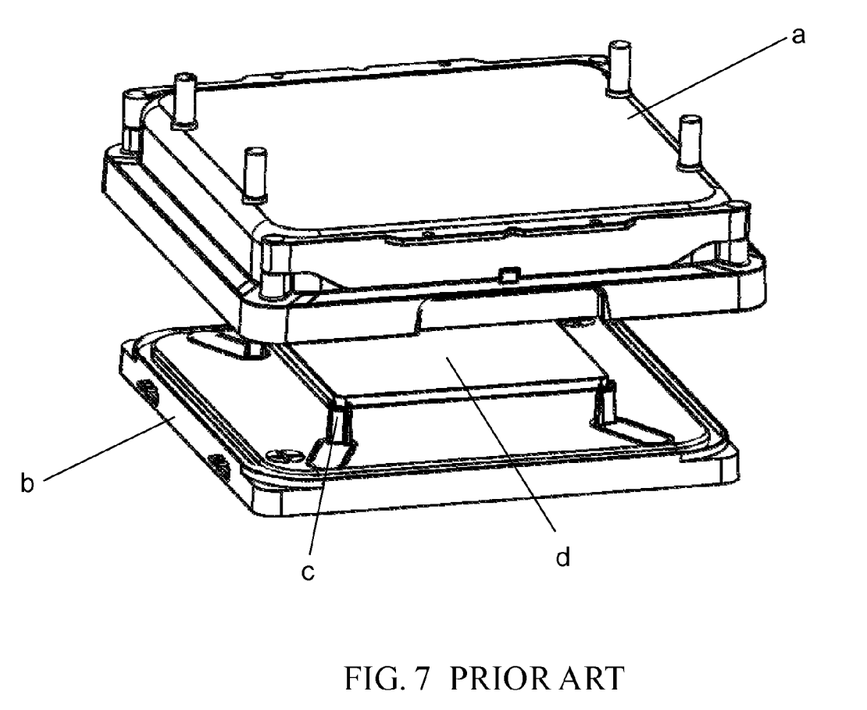
FIG. 7 is a view of the reticle pod of prior art.

A reticle pod of conventional art, as shown in FIG. 7, usually comprises a shell a, on which are disposed with multiple supporting components c for sustaining reticle d. The supporting components c can sustain the lower surface of reticle d and restrict the two edges of the reticle, and the supporting components c can be rested on by the reticle for securing the reticle. A base b opposite to the shell a, which covers and joins with the shell a to form a space for storing reticle d. Meantime, gas is filled into the storage device of reticle d to maintain the cleanliness.

However, in order to further increase the yield of products and reduce the cost of production, not only is the standard of cleanliness to be complied to, but the problem of pollution of reticles caused by external gas is also to be overcome. The sources of external gas include, in addition to air, outgas released by the storage device itself which is made of polymer material and volatile gas generated from residue of trace amount of chemical solution on reticles or semiconductor components. These unexpected gases will cause haze on the surface of reticles or semiconductor components, which will then make reticles or semiconductor components defective and discardable and lead to increase of production cost. It is thus an important issue to explore how to solve the problem of reticle haze by filling in gas in reticle pods of prior art. Taking the aforementioned concern into consideration, the present invention provides a reticle pod having the function of gas exchange in pellicle film.

SUMMARY OF THE INVENTION

According to the description above, one primary object of the present invention is to provide a gas exchange device disposed in the reticle pod, the structure of which is designed to generate strong gas flow and set the pellicle film in floating motion in accordance with the Bernoulli's principle and is thus able to achieve the function of gas exchange in the pellicle film.

Another primary object of the present invention is to provide a gas exchange device disposed in the reticle pod, in which the function of gas exchange in the pellicle film on the reticle is achieved by controlling the switching-on and shutting-off of the gas filling into the reticle pod. Therefore, impurities and volatile chemical gases in the interior can be brought out and the cleanliness of storage device can be enhanced, and thus the product yield is increased and the cost of defective reticles is reduced.

According to the objects above, the present invention first provides a reticle pod disposed with gas exchange structure. The reticle pod is composed with a cover with a first circumferential wall and a base with a second circumferential wall on which at least a pair of upwardly protruding through holes are disposed, an accommodation space being formed by the first circumferential wall and the second circumferential wall for accommodate and fasten a reticle substrate. The characteristic of the reticle pod is that a gas exchange structure is installed on the second circumferential wall of the base, wherein the gas exchange structure comprises: a gas chamber base, four edges of which extend upward to form a third circumferential wall; at least a pair of downwardly protruding through holes disposed on said gas chamber base and opposite to each other at a distance, the position of the at least a pair of downwardly protruding through holes corresponding to that of the at least a pair of upwardly protruding through holes on the base; a first partition disposed on the third circumferential wall of the gas chamber base, a gas chamber being formed between the first partition and the gas chamber base and a gas channel being formed on the first partition; a second partition disposed on the first partition, a gas flow guiding room being formed between the second partition and the first partition and a gap being formed between the third circumferential wall and the second partition whose square measure is smaller than that of the first partition.

The present invention then provides a reticle pod disposed with gas exchange structure. The reticle pod is composed of a cover with a first circumferential wall and a base with a second circumferential wall; an accommodation space is formed by the first circumferential wall and the second circumferential when the cover closes and joins with the base for accommodating and fastening a reticle substrate. At least a pair of upwardly protruding through holes are disposed on the second circumferential wall. The characteristic of the reticle pod is that a gas exchange structure is installed on the second circumferential wall of the base, wherein the gas exchange structure comprises: a gas chamber base, the four edges of which extending upward to form a third circumferential wall; at least a pair of downwardly protruding through holes disposed on the gas chamber base and opposite to each other at a distance, the location of the at least a pair of downwardly protruding through holes corresponding to that of the at least a pair of upwardly protruding through holes; a first partition disposed on the third circumferential wall of the gas chamber base, a gas chamber being formed between the first partition and the gas chamber base and a gas channel being formed on the first partition; a second partition disposed on the first partition, a gas flow guiding room being formed between the second partition and the first partition and a gap being formed between the third circumferential wall and the second partition whose square measure is smaller than that of the first partition; and a reticle substrate, the structure of which comprises: an upper surface and a lower surface, a rectangular frame with certain thickness formed on the upper surface of the reticle substrate; a ventilation hole disposed on one edge of the rectangular frame, a pellicle film layer formed on said rectangular frame such that a close space to be formed by said pellicle film layer supported with the thickness of said rectangular frame and the upper surface of said reticle substrate.

The present invention then provides a reticle pod disposed with gas exchange structure, which is composed by a cover with a first circumferential wall and a base with a second circumferential wall on which are at least a pair of upwardly protruding through holes, an accommodation space being formed by the first circumferential wall and the second circumferential wall for accommodating and fastening a reticle substrate, the characteristic of the reticle pod being that a gas exchange structure is installed on the second circumferential wall of the base, wherein the gas exchange structure comprises: a gas chamber base, four edges of which extend upward to form a third circumferential wall; at least a pair of downwardly protruding through holes disposed on the gas chamber base and opposite to each other at a distance, the position of the at least a pair of downwardly protruding through holes corresponding to that of the at least a pair of upwardly protruding through holes; a first partition disposed on the third circumferential wall of the gas chamber base, a gas chamber being formed between the first partition and the gas chamber base and a gas channel being formed on the first partition; a second partition disposed on the third circumferential wall, a gas flow guiding room being formed between the second partition and the first partition, and a plurality of gaps are disposed on four sides of the second partition.

With the design provided by the present invention, gas in the pellicle film can be speedily exchanged anytime and anywhere, and damages to important patterns in the reticle caused by impurities deposited in the interior or volatile chemical gases generated from operation process can be further prevented.

DESCRIPTION OF THE PREFERRED EMBODIMENT

The present invention discloses a reticle pod disposed with gas exchange structure. Some structures and employments of reticles, reticle pods, or supporting components or gas inlets in reticle pods are achieved by employment current technology and are thus not detailedly described in the following description. Moreover, the drawings referred to in the following are not made according to actual sizes or in a complete manner, the function of which is only to illustrate characteristics of the present invention.

Figure 1:
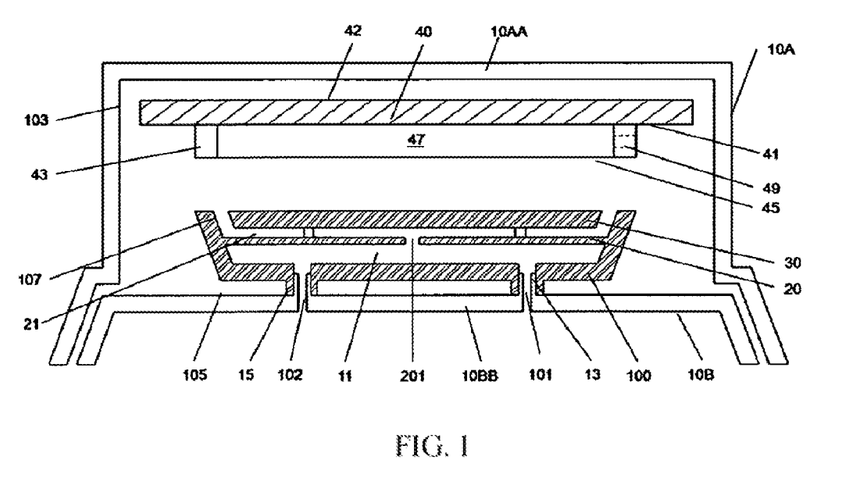
FIG. 1 is a sectional view of the present invention.

First, referring to FIG. 1, which is a sectional view of reticle pod of the present invention having gas exchange function. As shown in FIG. 1, the reticle pod is composed of an upper cover 10A and a lower cover 10B, wherein the upper cover 10A is formed by a cover 10AA and a first circumferential wall 103 connected to the cover 10AA, and the lower cover 10B is formed by a base 10BB and a second circumferential wall 105 connected to the base 10BB. An accommodation space is formed by the first circumferential wall 103 of the cover 10A and the second circumferential wall 105 of the cover 10B for accommodating a reticle. Wherein the second circumferential wall 105 is disposed with at least a pair of upwardly protruding through holes 13, on which a gas exchange structure is installed for forming dynamic gas flow field in the interior of reticle pod with gas that is filled in.

The gas exchange structure of the present invention comprises a gas chamber base 100 and a third circumferential wall 107 connecting with four edges of the gas chamber base 100 and extending upward; the gas chamber base 100 is disposed with at least a pair of downwardly protruding through holes 15, the position of which corresponds to that of the pair of upwardly protruding through holes 13 on the second circumferential wall 105. In the present embodiment, the downwardly protruding through holes 15 are larger than the upwardly protruding through holes 13 on the second circumferential wall 105. Therefore, the gas exchange structure can be assembled via the through holes 15 and the through holes 13 on the second circumferential wall 105; for example, when the gas exchange structure is installed on the second circumferential wall 105, the upwardly protruding through holes 13 snap fit with the downwardly protruding through holes 15 and the protruding parts of the downwardly protruding through holes 15 contact the second circumferential wall 105 after being snap-fitted; therefore, a distance is kept between the gas exchange structure and the second circumferential wall 105. When the upwardly and downwardly protruding through holes 13 and 15 are joined with each other, the upwardly protruding through holes 13 and the downwardly protruding through holes 15 are connected and form a pair of gas channels, the at least a pair of gas channels comprising at least a gas inlet 101 and at least a gas outlet 102. Then, a first partition 20 is disposed at interval on the third circumferential wall 107 for a gas chamber 11 to be formed between the gas chamber base 100 and the first partition 20, wherein a gas channel 201 is formed on the first partition 20 near the center. And then, a second partition 30 is disposed at interval and fastened onto the first partition 20 for a gas flow guiding room 21 to be formed, as shown in FIG. 1.

A reticle substrate 40, comprising an upper surface 41 and a lower surface 42, a rectangular frame 43 with certain thickness formed on the upper surface 41 of the reticle substrate 40, the size of the frame 43 being the same as that of the gas exchange structure, a ventilation hole 49 disposed on one edge of the rectangular frame 43, and a pellicle film layer 45 further formed on the rectangular frame 43 such that a close space 47 to be formed by the pellicle film layer 45 supported with the thickness of the rectangular frame 43 and the upper surface 41 of the reticle substrate 40. Similar to the prior art, the reticle substrate 40 is fastened right on top of the third partition 30 when it is placed between the upper cover 10A and the lower cover 10B of the reticle pod for a distance to be kept between the pellicle film layer 45 disposed on the frame 43 and the third partition 30.

Figure 2:
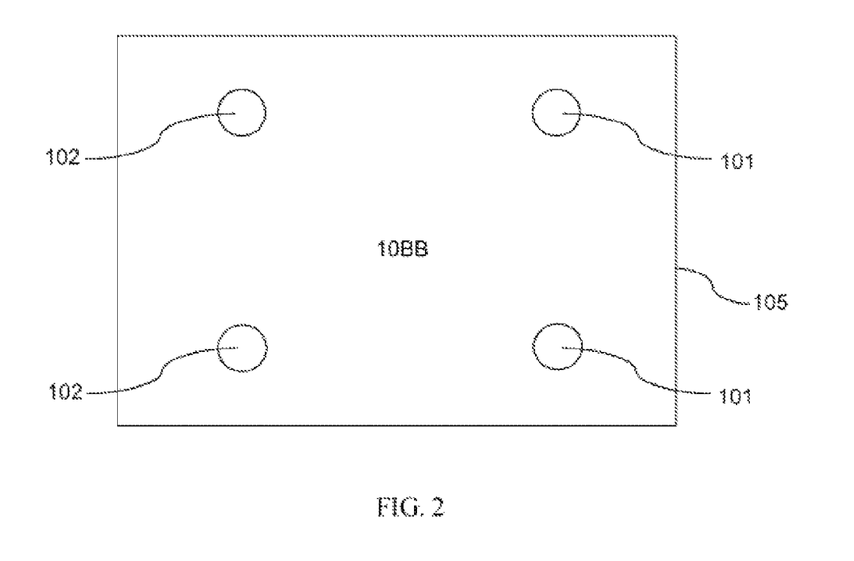
FIG. 2 is a top view of the base of the first embodiment of the present invention.
Figure 3:
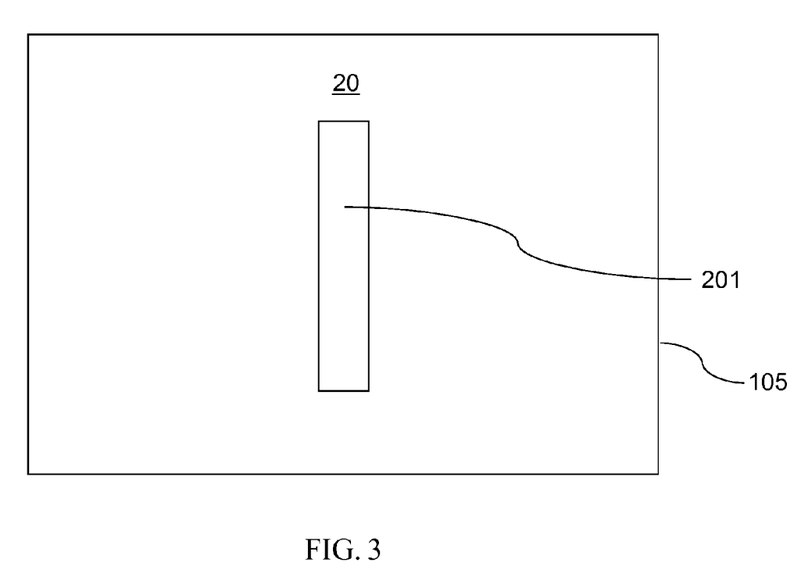
FIG. 3 is a top view of the first partition of the first embodiment of the present invention.
Figure 4:
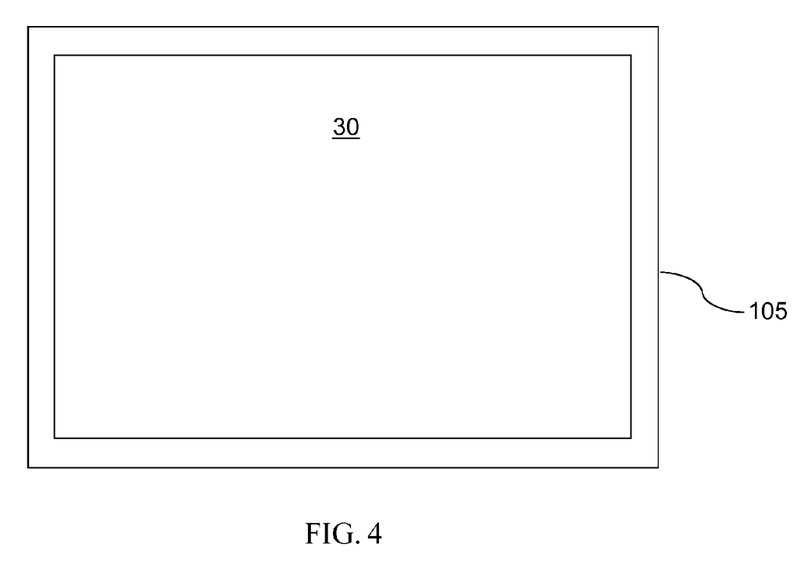
FIG. 4 is a top view of the second partition of the first embodiment of the present invention.

Then, referring to FIG. 2, FIG. 3, and FIG. 4, which are top views of each partition in the gas exchange structure of the present invention. First, as shown in FIG. 2, a gas chamber base 100 is disposed with at least a pair of downwardly protruding through holes 15; in a preferred embodiment, the gas chamber base 100 is disposed with two pairs of downwardly protruding through holes 15 and the base 10BB is also disposed with two pairs of upwardly protruding through holes 13; the downwardly protruding through holes 15 and the upwardly protruding though holes 13 join together and form a pair of gas inlets 101 and a pair of gas outlets 102. When the reticle pod is placed on a load port (not shown in Figure), the gas purging device and the gas exhausting device (not shown in Figure) contact the gas inlets 101 and the gas outlets 102, and dry, clean gas is filled into the air-tight reticle pod by the gas purging device and gas in the reticle pod is then exhausted by the gas exhausting device; a gas flow field is thus formed in the reticle pod. Then, referring to FIG. 3, a gas channel 201 is disposed on a first partition 20 near the center, the function of which is to provide flowing route for the filled-in gas to follow when gas is filled into the gas chamber 11 between the gas chamber base 100 and the first partition 20. Apparently, when the filled-in gas flows out along the gas channel 201, the velocity of filled-in gas increases. The smaller the gas channel 201 is, the higher the velocity of filled-in gas becomes. Moreover, the shape of gas channel 201 is not limited in the present embodiment and can also be formed by, for example, a plurality of through holes. Furthermore, referring to FIG. 4, a second partition 30 is fastened onto the first partition 20 for a gas flow guiding room 20 to be formed between the second partition 30 and the first partition 20. The method for fastening can be, for example, using pillars at four corners of the second partition 30 for fastening the second partition 30 onto the first partition 20 and is not limited in the present invention. Meantime, a gap is evenly kept between the second partition 30 and the third circumferential wall 107 of the gas chamber base 100; when the filled-in gas flows out of the gas channel 201 at high velocity, the second partition 30 blocks the high-velocity gas flow and forces the gas to flow out of the gap between the second partition 30 and the third circumferential wall 107. Therefore, it is apparent that the square measure of the second partition 30 of the present invention is smaller than that of the first partition 20.

Figure 5A:
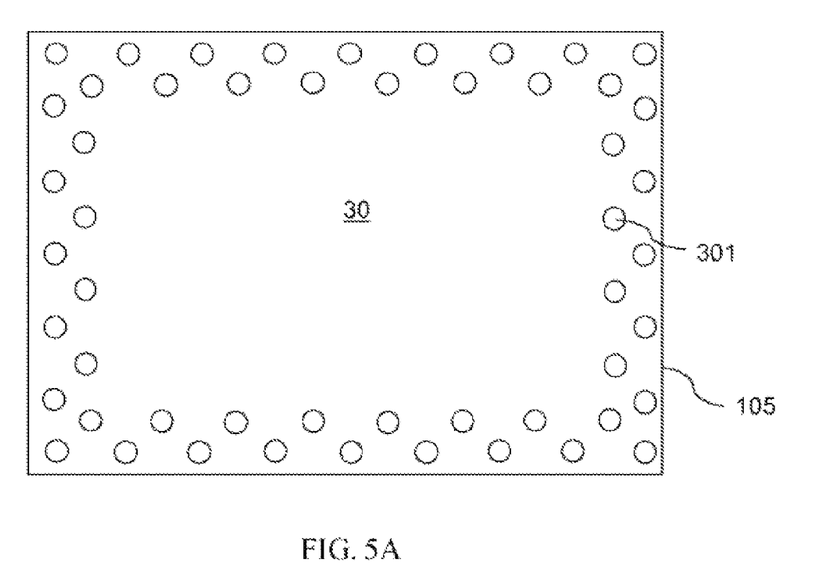
FIG. 5A is a top view of the second partition of another embodiment of the present invention.
Figure 5B:
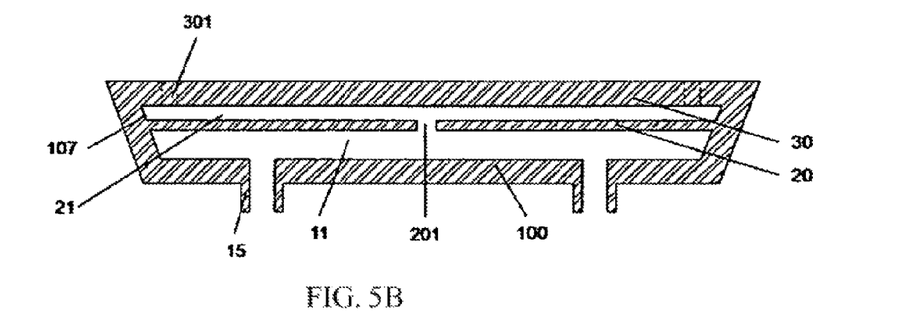
FIG. 5B is a sectional view of the second partition of another embodiment of the present invention.

In addition, another embodiment of the second partition 30 is shown in FIG. 5A and FIG. 5B. First, referring to FIG. 5A, the second partition 30 is disposed and fastened onto the first partition 20 for a gas flow guiding room 21 to be formed between the second partition 30 and the first partition 20. The second partition 30 is fastened between the third circumferential wall 107 of the base 10B and the first partition 20, and therefore a gas flow guiding room 21 can be formed between the second partition 30 and the first partition 20. As the second partition 30 is fastened to the third circumferential wall 107, the gap 301 disposed around the second partition 30 can force the high-velocity gas flow to flow out from the gap 301 of the third partition 30. Meantime, the shape of gap 301 is not limited in the present embodiment.

What is to be emphasized in the following is that, the gas exchange structure in the present embodiment can be manufactured by integrated molding, for example, by applying injection molding or injection-press molding technologies, and the material can be polymer material. Moreover, the gas exchange structure in the present embodiment can also be formed by assembly, for example, by assembling parts manufactured by stamping process such as gas chamber base 100, first partition 20, and second partition 30, and the material can be polymer material or metal material.

Figure 6A:
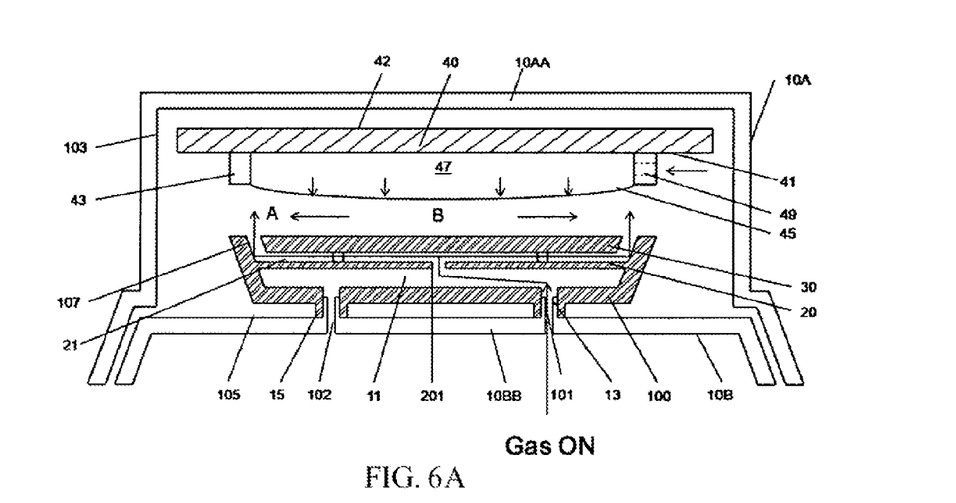
FIG. 6A is a sectional view of the first embodiment of the present invention in gas-filling status.

And then, referring to FIG. 6A, which is a view of reticle pod having gas exchange structure of the first embodiment of the present invention in the gas-filling status. After the reticle pod is carried onto the load port, at the time for filling in gas, the gas purging device is controlled by the load port to fill gas into the gas chamber 11 between the gas chamber base 100 and the first partition 20 via the gas inlet 101. When the pressure of gas filled into the gas chamber 11 reaches saturation, the gas will be brought through the gas channel 201 of the first partition 20 into the gas flow guiding room 21 between the first partition 20 and the second partition 30. Apparently, when gas is filled from one or multiple gas inlets 101 into the gas chamber 11, the gas flow in the gas chamber 11 will become chaotic. Therefore in the present invention, the objective of forming a gas channel 201 on the first partition 20 is to let all gas filled in from the gas inlet flow through the gas channel 201 to the gas flow guiding room 21 when the pressure of gas filled into the gas chamber 11 reaches saturation. Then, the gas in the gas flow guiding room 21 will, under the influence of the narrow space between the first partition 20 and the second partition 30 and the pushing force exerted by the gas channel 201, flow more rapidly toward the gap between the second partition 30 and the third circumferential wall 107 of the gas chamber wall 100. Furthermore, the gas exhausting device is at the same time controlled by the load port to exhaust gas from the gas outlet 102. In the process of filling in gas and exhausting filled-in gas of the reticle pod performed by the gas purging device and the gas exhausting device controlled by the load port, the filled-in gas thus forms a gas flow field in the reticle pod. Then, referring to the arrows indicating directions in FIG. 6A: when the gas flow field moves through the gas exchange structure of the gas chamber base 100, the gas flow flows rapidly through the gap between the third circumferential wall 107 of the gas chamber base 100. As a distance is kept between the pellicle film layer 45 on the frame 43 of reticle substrate 40 and the third circumferential wall 107, the gas flow field carries the gas between the pellicle film layer 45 and the second partition 30 away when the gas flow flows rapidly through the gap between the third circumferential wall 107 of the gas chamber base 100, and thus the pressure at B is smaller than the pressure in the closed space 47 between the pellicle film layer 45 and the upper surface 41 of the reticle substrate 40. Meantime, some gas diffuses into the closed space 47 through the ventilation hole 49 on the frame 43 and causes a downwardly pulling force to be exerted on the pellicle film layer 45 and making it incline closer to the second partition 30, which is a physical phenomenon in accordance with the Bernoulli's principle. Apparently, when the frame 43 of the present embodiment is disposed with at least one or multiple ventilation holes 49, the physical phenomenon in accordance with the Bernoulli's principle can also be formed. Such design is not limited in the present embodiment.

In the process of filling in gas, the gas not only diffuses into the closed space 47 through the ventilation hole 49 but also penetrates through the pellicle film layer 45. In the early stage of employment of pellicle film layer 45, the penetration rate of the pellicle film layer 45 is higher and thus the gas exchange efficiency can be increased by increasing the gas flow rate; however, at the final stage of employment, gas-exchange resistance in the gas exchange process increases as the penetration rate of the pellicle film layer 45 becomes low and the deformation rate of pellicle film also increases. In order to keep the deformation of the pellicle film layer 45 within affordable degree at the final stage of employment of pellicle film layer 45, the rate of gas flow filled in has to be properly adjusted as lower to extend the duration of pellicle film.

Figure 6B:
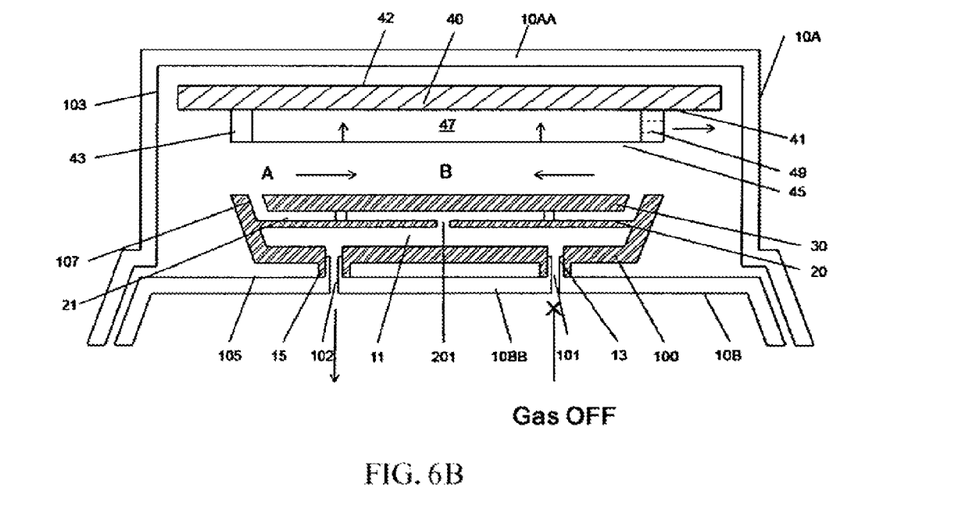
FIG. 6B is a view of the first embodiment of the present invention in the status in which gas filling is terminated.

Then, referring to FIG. 6B, which is a view of reticle pod having gas exchange structure of the present invention in the status in which gas-filling is terminated. When the gas purging device is controlled by the load port to stop filling in gas through the gas inlet 101, the field formed by gas flow thus disappears. Meantime, in accordance with Bernoulli's principle, the pressure at A and the pressure at B in the interior of reticle pod resumes to be balanced, and the downwardly pulling force exerted on the pellicle film layer 45 disappears. Thus, the pellicle film layer 45 resumes to original status, and with the force generated by the pellicle film layer 45 when resuming to original status, gas in the closed space 47 can be exhausted from the ventilation hole 49. Then, the gases are exhausted from the gas outlet 102 by the gas exhausting device and out of the reticle pod. Apparently, in the reticle pod of the present embodiment, in the process in which gas is filled in by the gas purging device controlled by the load port or the gas-filling is terminated, the phenomenon of gas flow field in accordance with Bernoulli's principle sets the pellicle film layer 45 in motion, the motion of which is similar to the breathing motion of human beings. And thus by controlling the regular motion generated between the pellicle film layer 45 on the reticle substrate 40 and the frame 43, impurities in the closed space 47 or on the upper surface 41 on reticle substrate 40 or volatile chemical gases can be carried out to achieve the function of cleaning.

Although the present invention has been described with reference to the aforementioned preferred embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A reticle pod disposed with gas exchange structure, comprising an upper cover and a lower cover, said upper cover being formed by a cover and a first circumferential wall connected to said cover, said lower cover being formed by a base and a second circumferential wall connected to said base, an accommodation space being formed by said first circumferential wall and said second circumferential wall for accommodating and fastening a reticle substrate when said upper cover and said lower cover close and join with each other, at least a pair of upwardly protruding through holes being disposed on said base opposite to each other at a distance, the characteristic of said reticle pod being that a gas exchange structure is installed on said base of said lower cover, wherein said gas exchange structure comprises:
   a gas chamber base, four edges of which being connected to a third circumferential wall that extends upward;
      at least a pair of downwardly protruding through holes disposed on said gas chamber base opposite to each other at a distance, position of said plurality of downwardly protruding through holes corresponding to position of said plurality of upwardly protruding through holes;
      a first partition, having a first surface and a second surface opposite to said first surface, said first partition being disposed on said third circumferential wall and a gas chamber being formed between said second surface of said first partition and said gas chamber base, a gas channel being further formed on said first partition; and
   a second partition disposed on said first surface of said first partition, a gas flow guiding room being formed between said second partition and said first partition, square measure of said second partition being smaller than square measure of said first partition for gap to be formed between said second partition and said third circumferential wall;
   wherein said gas exchange structure is fastened to said base with said plurality of downwardly protruding through holes snap-fitting with said plurality of upwardly protruding through holes, gas channels being formed by said plurality of downwardly protruding through holes and said plurality of upwardly protruding through holes.

2. The reticle pod according to claim 1, wherein said gas exchange structure is a structure manufactured by integrated molding.

3. The reticle pod according to claim 2, wherein material of said gas exchange structure is polymer material.

4. The reticle pod according to claim 1, wherein material of said gas exchange structure is metal material.

5. The reticle pod according to claim 1, wherein diameter of said downwardly protruding through holes is larger than diameter of said upwardly protruding through holes.

6. The reticle pod according to claim 1, wherein structure of said reticle substrate comprises:
   an upper surface and a lower surface opposite to another side of said upper surface;
   a rectangular frame, having certain thickness and being formed on said upper surface of said reticle substrate;
   a ventilation hole, disposed on one edge of said rectangular frame;
   a pellicle film layer formed on said rectangular frame such that a close space to be formed by said pellicle film layer supported with the thickness of said rectangular frame and the upper surface of said reticle substrate.

7. The reticle pod according to claim 1, wherein size of said third circumferential wall of said gas exchange structure is the same as size of said rectangular frame.

8. The reticle pod according to claim 1, wherein structure of said reticle substrate comprises:
   an upper surface and a lower surface opposite to another side of said upper surface;
   a rectangular frame, having certain thickness and being formed on said upper surface of said reticle substrate;
   a plurality of ventilation holes, disposed on at least one edge of said rectangular frame;
   a pellicle film layer formed on said rectangular frame such that a close space to be formed by said pellicle film layer supported with the thickness of said rectangular frame and the upper surface of said reticle substrate.

9. A reticle pod disposed with gas exchange structure, comprising an upper cover and a lower cover, said upper cover being formed by a cover and a first circumferential wall connected to said cover, said lower cover being formed by a base and a second circumferential wall connected to said base, an accommodation space being formed by said first circumferential wall and said second circumferential wall for accommodating and fastening a reticle substrate when said upper cover and said lower cover close and join with each other, at least a pair of upwardly protruding through holes being disposed on said base, the characteristic of said reticle pod being that a gas exchange structure is installed on said base of said lower cover, wherein said gas exchange structure comprises:
- a gas chamber base, four edges of which being connected to a third circumferential wall that extends upward;
    - at least a pair of downwardly protruding through holes disposed on said gas chamber base opposite to each other at a distance, position of said at least a pair of downwardly protruding through holes corresponding to position of said at least a pair of upwardly protruding through holes;
- a first partition, having a first surface and a second surface opposite to said first surface, said first partition being disposed on said third circumferential wall and a gas chamber being formed between said second surface of said first partition and said gas chamber base, a gas channel being further formed on said first partition; and
- a second partition having a first surface and a second surface opposite to said first surface, said second partition being disposed on said third circumferential wall, a gas flow guiding room being formed between said second surface of said second partition and said first surface of said first partition, a plurality of gaps being further disposed on four sides of said second partition;
- wherein said gas exchange structure is fastened to said base with said plurality of downwardly protruding through holes snap-fitting with said plurality of upwardly protruding through holes, gas channels being formed by said plurality of downwardly protruding through holes and said plurality of upwardly protruding through holes.

10. The reticle pod according to claim 9, wherein said gas exchange structure is a structure manufactured by integrated molding.

11. The reticle pod according to claim 10, wherein material of said gas exchange structure is polymer material.

12. The reticle pod according to claim 9, wherein material of said gas exchange structure is metal material.

13. The reticle pod according to claim 9, wherein diameter of said downwardly protruding through holes is larger than diameter of said upwardly protruding through holes.

14. The reticle pod according to claim 9, wherein structure of said reticle substrate comprises:
- an upper surface and a lower surface opposite to another side of said upper surface;
    - a rectangular frame, having certain thickness and being formed on said upper surface of said reticle substrate;
    - a ventilation hole, disposed on one edge of said rectangular frame;
    - a pellicle film layer formed on said rectangular frame such that a close space to be formed by said pellicle film layer supported with the thickness of said rectangular frame and the upper surface of said reticle substrate.

15. The reticle pod according to claim 9, wherein size of said third circumferential wall of said gas exchange structure is the same as size of said rectangular frame.

16. The reticle pod according to claim 9, wherein structure of said reticle substrate comprises:
- an upper surface and a lower surface opposite to another side of said upper surface;
    - a rectangular frame, having certain thickness and being formed on said upper surface of said reticle substrate;
- a plurality of ventilation holes, disposed on at least one edge of said rectangular frame;
- a pellicle film layer formed on said rectangular frame such that a close space to be formed by said pellicle film layer supported with the thickness of said rectangular frame and the upper surface of said reticle substrate.

* * * * *